United States Patent
Sung et al.

(10) Patent No.: US 11,694,621 B2
(45) Date of Patent: Jul. 4, 2023

(54) DISPLAY DEVICE AND OPERATING METHOD THEREOF

(71) Applicant: Samsung Display Co., Ltd., Yongin-Si (KR)

(72) Inventors: Jeong Min Sung, Yongin-si (KR); Woo Chul Kim, Yongin-si (KR); Weon Jun Choe, Yongin-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 17/718,106

(22) Filed: Apr. 11, 2022

(65) Prior Publication Data

US 2022/0238072 A1 Jul. 28, 2022

Related U.S. Application Data

(63) Continuation of application No. 16/908,582, filed on Jun. 22, 2020, now Pat. No. 11,302,251, which is a (Continued)

(30) Foreign Application Priority Data

Oct. 18, 2017 (KR) .................. 10-2017-0135135

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/2022* (2013.01); *G09G 3/3266* (2013.01);
(Continued)

(58) Field of Classification Search
CPC .. G09G 3/3233; G09G 3/2022; G09G 3/3266; G09G 2310/08; G09G 2310/0286;
(Continued)

(56) References Cited

U.S. PATENT DOCUMENTS 5,751,379 A  5/1998 Markandey et al.
7,403,213 B1  7/2008 Morgan et al.
(Continued)

FOREIGN PATENT DOCUMENTS

AU  2007254860 A1 *  1/2009  ....... G02F 1/133362
AU  2013301200 A1 *  3/2015  ............. G02B 26/08
(Continued)

*Primary Examiner* — Vinh T Lam
(74) *Attorney, Agent, or Firm* — Innovation Counsel LLP

(57) ABSTRACT

A display device may include a pixel, an emission control driver, and a timing controller. The emission control driver may supply an emission control signal set for controlling emission periods of the pixel. The timing controller may receive a received bit stream that includes a first bit set and a second bit set, may determine a first duty ratio of the emission control signal set using bits of the first bit set without using any bit of the second bit set. The first bit set may include at least two bits. The second bit set may include at least one bit. The emission control signal set may control the pixel to operate according to the first duty ratio for each frame of a first frame group.

10 Claims, 9 Drawing Sheets

Related U.S. Application Data continuation of application No. 16/046,788, filed on Jul. 26, 2018, now Pat. No. 10,692,429.

(51) Int. Cl.
  *G09G 3/20* (2006.01)
  *G11C 19/28* (2006.01)
  *G09G 3/3275* (2016.01)

(52) U.S. Cl.
  CPC ........... *G11C 19/28* (2013.01); *G09G 3/3275* (2013.01); *G09G 2300/0842* (2013.01); *G09G 2300/0861* (2013.01); *G09G 2310/0286* (2013.01); *G09G 2310/08* (2013.01); *G09G 2320/064* (2013.01)

(58) Field of Classification Search
  CPC ..... G09G 2320/064; G09G 2300/0861; G09G 3/3275; G09G 2300/0842; G11C 19/28
  See application file for complete search history.

(56) References Cited

U.S. PATENT DOCUMENTS

| | | | |
|---|---|---|---|
| 7,502,039 B2 | 3/2009 | Koyama et al. | |
| 7,502,040 B2 | 3/2009 | Kawae | |
| 7,800,315 B2 * | 9/2010 | Shteynberg | H05B 45/28 315/307 |
| 7,929,001 B2 | 4/2011 | Bae et al. | |
| 7,956,554 B2 * | 6/2011 | Shteynberg | G09G 3/3413 345/82 |
| 8,253,349 B2 * | 8/2012 | Shteynberg | H05B 45/24 315/307 |
| 8,290,115 B2 | 10/2012 | Kim et al. | |
| 8,537,182 B2 | 9/2013 | Hasegawa et al. | |
| 8,599,915 B2 * | 12/2013 | Zhao | G09G 3/3406 345/204 |
| 8,605,123 B2 * | 12/2013 | Oh | G09G 3/3648 345/690 |
| 8,922,466 B2 | 12/2014 | Asano | |
| 9,001,092 B2 | 4/2015 | Kim | |
| 9,142,188 B2 | 9/2015 | Kurikko | |
| 9,386,651 B2 * | 7/2016 | Lee | H05B 45/10 |
| 9,418,589 B2 | 8/2016 | Kim et al. | |
| 9,478,166 B2 * | 10/2016 | Pyo | G09G 3/3233 |
| 9,524,679 B2 | 12/2016 | Aitken et al. | |
| 9,905,159 B2 * | 2/2018 | Genoe | G09G 3/3258 |
| 10,319,295 B2 * | 6/2019 | Yin | G09G 3/2007 |
| 10,847,077 B2 * | 11/2020 | Sakariya | G09G 3/2085 |
| 2002/0047852 A1 | 4/2002 | Inukai et al. | |
| 2003/0020677 A1 | 1/2003 | Nakano | |
| 2005/0001857 A1 | 1/2005 | Nakakita et al. | |
| 2006/0077138 A1 | 4/2006 | Kim | |
| 2006/0119554 A1 | 6/2006 | Kawae | |
| 2006/0244391 A1 | 11/2006 | Shishido et al. | |
| 2007/0035488 A1 | 2/2007 | Kimura | |
| 2007/0109242 A1 | 5/2007 | Lee | |
| 2008/0055219 A1 | 3/2008 | Jung et al. | |
| 2008/0122873 A1 | 5/2008 | Hong et al. | |
| 2008/0291135 A1 | 11/2008 | Kim et al. | |
| 2009/0079359 A1 * | 3/2009 | Shteynberg | H05B 45/24 315/291 |
| 2009/0079360 A1 * | 3/2009 | Shteynberg | H05B 45/24 315/291 |
| 2010/0117935 A1 | 5/2010 | Seo et al. | |
| 2011/0115394 A1 * | 5/2011 | Shteynberg | H05B 45/3725 315/250 |
| 2011/0249033 A1 * | 10/2011 | Oh | G09G 3/3648 345/690 |
| 2013/0050299 A1 | 2/2013 | Yoshinaga | |
| 2013/0229444 A1 | 9/2013 | Teranishi et al. | |
| 2013/0241966 A1 | 9/2013 | Tsuge | |
| 2015/0015557 A1 | 1/2015 | Kim | |
| 2015/0138258 A1 * | 5/2015 | Lee | G09G 3/3233 345/691 |
| 2015/0364080 A1 | 12/2015 | Lee | |
| 2016/0189605 A1 | 6/2016 | Ahn et al. | |
| 2016/0189620 A1 | 6/2016 | Park et al. | |
| 2016/0300525 A1 | 10/2016 | Segura Puchades | |
| 2017/0061878 A1 * | 3/2017 | Park | G09G 3/3233 |
| 2017/0116941 A1 | 4/2017 | Baek et al. | |
| 2018/0090101 A1 | 3/2018 | Offredi et al. | |
| 2018/0151132 A1 * | 5/2018 | Lee | G09G 3/3406 |

FOREIGN PATENT DOCUMENTS

| | | | | |
|---|---|---|---|---|
| CA | 2835125 A1 * | 11/2012 | ......... | G09G 3/2029 |
| CN | 1155217 A | 7/1997 | | |
| CN | 1501698 A | 6/2004 | | |
| CN | 1518736 A | 8/2004 | | |
| CN | 101165752 A | 4/2008 | | |
| CN | 102411908 A | 4/2012 | | |
| CN | 104781870 A * | 7/2015 | ............. | G02F 1/13 |
| EP | 1936590 A2 * | 6/2008 | ......... | G09G 3/2022 |
| JP | 2006-189803 A | 7/2006 | | |
| JP | 4650854 B2 * | 3/2011 | ............ | G02B 26/02 |
| JP | 5395728 B2 * | 1/2014 | ......... | G09G 3/3275 |
| KR | 10-0632810 B1 | 10/2006 | | |
| KR | 10-1056213 B1 | 8/2011 | | |
| KR | 10-2017-0026971 A | 3/2017 | | |
| KR | 10-2017-0049701 A | 5/2017 | | |
| MY | 157840 A * | 7/2016 | ....... | G02F 1/133362 |
| TW | 201426710 A * | 7/2014 | ............. | G02F 1/13 |
| WO | WO-2014068017 A1 * | 5/2014 | ............. | G02F 1/13 |
| WO | WO-2016196390 A1 * | 12/2016 | ......... | G09G 3/2014 |
| WO | WO-2017113678 A1 * | 7/2017 | ......... | G09G 3/2007 |

* cited by examiner

1

DISPLAY DEVICE AND OPERATING METHOD THEREOF

CROSS-REFERENCE TO RELATED APPLICATIONS

This application is a continuation application of U.S. patent application Ser. No. 16/908,582 filed on Jun. 22, 2020, which is a continuation application of U.S. patent application Ser. No. 16/046,788 filed on Jul. 26, 2018 (U.S. Pat. No. 10,692,429), which claims priority to Korean Patent Application No. 10-2017-0135135 filed on Oct. 18, 2017 in the Korean Intellectual Property Office; the prior applications are incorporated by reference.

BACKGROUND

1. Field

The technical field relates to a display device and an operating method of the display device.

2. Description of the Related Art

A display device, such as an organic light emitting display device, may display images using organic light emitting diodes that generate light by combination of electrons and holes. An organic light emitting display device may have a high response speed and may operate with low power consumption.

An organic light emitting display device may display a target image by providing a data voltage in each pixel for the corresponding organic light emitting diode to emit light according to the data voltage.

SUMMARY

Embodiments may be related to a display device capable of expressing a dimming level similar to a target dimming level with minimum switching power consumption of a dimming controller. Embodiments may be related to a driving method (i.e., operating method) of the display device.

Embodiments may be related to a display device having a satisfactory number of expressible dimming levels and including a low-resolution display panel. Embodiments may be related to a driving method of the display device.

According to an embodiment, a display device may include the following elements: a pixel unit including a plurality of pixels; an emission control driver configured to supply an emission control signal for determining an emission period of the plurality of pixels; and a timing controller configured to determine a duty ratio of the emission control signal, using a duty ratio bit stream configured with m bits, wherein the timing controller determines the duty ratio bit stream including m–k most significant bits (MSBs) and k least significant bits (LSBs) having a fixed value, during n frames, wherein the k is a natural number of 1 or more, and the n and m are natural numbers of 2 or more.

The n may be $2^k$.

Frames of a first group among the n frames may be emission-controlled to correspond to the duty ratio bit stream which is a first duty ratio bit stream, frames of a second group among the n frames may be emission-controlled to correspond to the duty ratio bit stream which is a second duty ratio bit stream, and the first duty ratio bit stream and the second duty ratio bit stream are different.

2

The second duty ratio bit stream may have a value obtained by adding $2^k$ to a value of the first duty ratio bit stream.

The frames of the first group and the frames of the second group may be time-divisionally alternately disposed.

m–k MSBs of an average value of the duty ratio bit streams during the n frames may correspond to m–k MSBs of the first duty ratio bit stream.

According to an embodiment, a display device may include the following elements: a pixel unit including a plurality of pixels; an emission control driver configured to supply an emission control signal for determining an emission period of the plurality of pixels; and a timing controller configured to determine a duty ratio of the emission control signal, using a duty ratio bit stream configured with m+k bits, wherein the timing controller determines the duty ratio bit stream including k uppermost extension bits substituting for k LSBs, m–k MSBs, and the k LSBs having a fixed value, during n frames, wherein the k is a natural number of 1 or more, and the n and m are natural numbers of 2 or more.

Then may be $2^k$.

Frames of a first group among the n frames may be emission-controlled to correspond to the duty ratio bit stream which is a first duty ratio bit stream, frames of a second group among the n frames may be emission-controlled to correspond to the duty ratio bit stream which is a second duty ratio bit stream, and the first duty ratio bit stream and the second duty ratio bit stream are different.

The second duty ratio bit stream may have a value obtained by adding $2^k$ to the first duty ratio bit stream.

The frames of the first group and the frames of the second group may be time-divisionally alternately disposed.

The other bits except k LSBs of an average value of the duty ratio bit streams during the n frames may correspond to uppermost extension bits and MSBs of the first duty ratio bit stream.

According to an embodiment, a method for driving/operating a display device may include the following steps: supplying, by a timing controller, a control signal corresponding to a first duty ratio bit stream to an emission control driver; supplying, by the emission control driver, an emission control signal having a duty ratio corresponding to the first duty ratio bit stream to a pixel unit; supplying, by the timing controller, a control signal corresponding to a second duty ratio bit stream to the emission control driver, wherein the second duty ratio bit stream has a value obtained by adding $2^k$ to a value of the first duty ratio bit stream; and supplying, by the emission control driver, an emission control signal having a duty ratio corresponding to the second duty bit stream to the pixel unit.

The sum of a number of frames of a first group, which are emission-controlled corresponding to the first duty ratio bit stream, and a number of frames of a second group, which are emission-controlled corresponding to the second duty ratio bit stream, may be n. The k may be a natural number of 1 or more, and the n may be a natural number of 2 or more.

The n may be $2^k$.

The frames of the first group and the frames of the second group may be time-divisionally alternately disposed.

k LSBs of the first duty ratio bit stream may be 0, and k LSBs of the second duty ratio bit stream may be 0.

DETAILED DESCRIPTION

Figure 1:
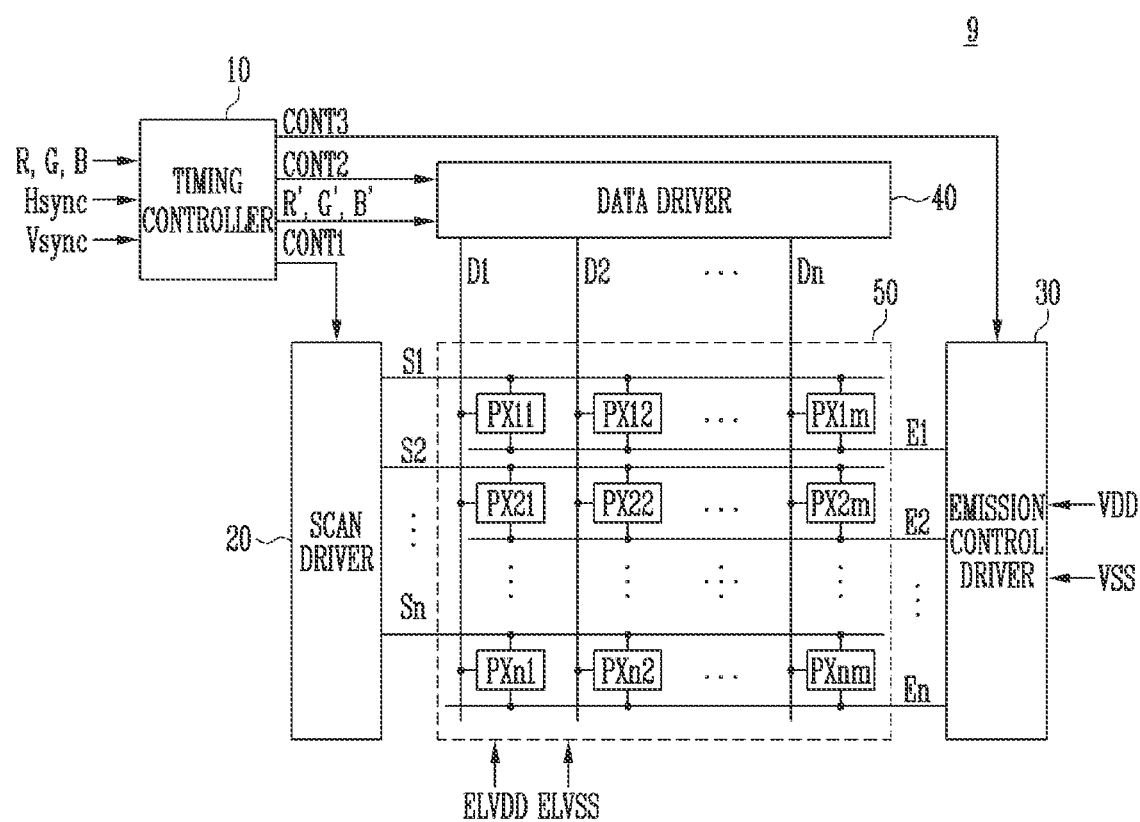
FIG. 1 is a diagram (e.g., a block diagram) illustrating a display device according to an embodiment.

Example embodiments are described in detail with reference to the accompanying drawings. Practical embodiments may be implemented in various forms and are not limited to the example embodiments.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

Same or similar constituent elements will be designated by same reference numerals.

The term "couple" may mean "electrically connected" or "electrically connected through no intervening transistor."

FIG. 1 is a diagram illustrating a display device according to an embodiment.

Referring to FIG. 1, the display device 9 includes a timing controller 10, a scan driver 20, an emission control driver 30, a data driver 40, and a pixel unit 50.

The timing controller 10 supplies a control signal CONT1 to the scan driver 10, supplies a control signal CONT3 to the emission control driver 30, and supplies a control signal CONT2 and image signals R', G', and B' to the data driver 40 by converting a control signal and image signals R, G, and B, which are supplied from the outside, to be suitable for specifications of the display device 9. The control signal received by the timing controller 10 may include a horizontal synchronization signal Hsync and a vertical synchronization signal Vsync.

The scan driver 20 generates a scan signal to be supplied to a plurality of scan lines S1, S2, . . . , and Sn by receiving the control signal CONT1. In an embodiment, the scan driver 20 may sequentially supply a scan signal to the plurality of scan lines S1, S2, . . . , and Sn. For example, the control signal CONT1 may include a gate start pulse GSP and a plurality of gate cock signals, and the scan driver 20 may be configured in the form of a shift register to generate a scan signal in a manner that sequentially transfer the gate start pulse to a next stage circuit under the control of the gate clock signal.

The data driver 40 generates a data voltage to be supplied to a plurality of data lines D1, D2, . . . , and Dm by receiving the control signal CONT2 and the image signal R', G', and B'. Data voltages generated in units of pixel rows may be simultaneously applied to the plurality of data lines D1, D2, . . . , and Dm according to an output control signal included in the control signal CONT2.

The pixel unit 50 may include a plurality of pixel circuits PX11, PX12, . . . , PX1$m$, PX21, PX22, . . . , PX2$m$, . . . , PXn1, PXn2, . . . , and PXnm. Each pixel may have a substantially identical pixel circuit structure. Each pixel circuit may be coupled to a corresponding data line and a corresponding scan line, and receive a data voltage input corresponding to a scan signal. The emission control driver 30 may supply emission control signals E1, E2, . . . , and En for determining emission periods of the plurality of pixel circuits PX11, PX12, . . . , PX1$m$, PX21, PX22, . . . , PX2$m$, . . . , PXn1, PXn2, . . . , and PXnm to emission control lines. For example, each pixel circuit may include an emission control transistor, and the flow of current through the organic light emitting diode may be determined according to on/off of the emission control transistor, so that the emission of the organic light emitting diode is controlled.

Figure 2:
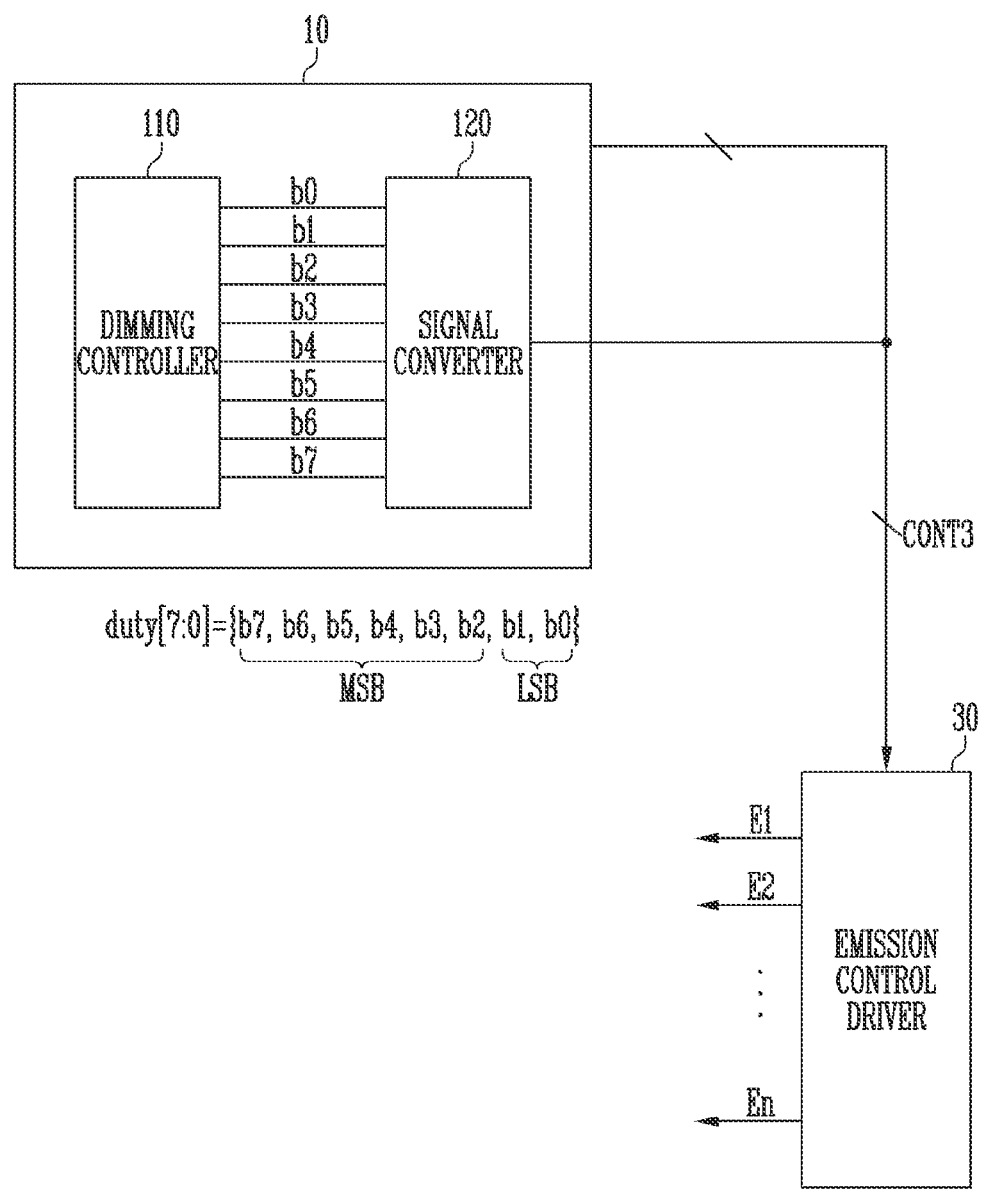
FIG. 2 is a diagram (e.g., a block diagram) illustrating a timing controller according to an embodiment.

FIG. 2 is a diagram illustrating a timing controller according to an embodiment.

Referring to FIG. 2, the timing controller 10 may include a dimming controller 110 and a signal converter 120.

The dimming controller 110 may determine a duty ratio of an emission control signal, using a duty ratio bit stream duty[7:0]. In the following drawings from FIG. 2, for convenience of description, it is assumed that the duty ratio bit stream duty[7:0] has 8 bits. In embodiments, the duty ratio bit stream may be configured with m bits to be expressed as duty[(m−1):0]. Here, m may be a natural number of 2 or more.

The dimming controller 110 may include a transistor coupled to each bit signal line to express a binary level, i.e., 0 or 1 of each bit. For example, when the transistor is to be turned on, binary level 1 may be expressed with a specific voltage applied to a corresponding bit signal line. When the transistor is to be turned off, binary level 0 may be expressed with another voltage of the corresponding bit signal line. The existing open drain and open collector structures may be applied as the coupling structure of the transistors and the bit signal lines. A pull-up resistor or a pull-down resistor may be coupled to this structure. Those skilled in the art may re-design various coupling relations of the transistors and the bit signal lines of the dimming controller 110.

In an embodiment, the dimming controller 110 may consume switching control power of all eight transistors to express the duty ratio bit stream duty[7:0].

According to an embodiment, k least significant bits (LSBs) in the duty ratio bit stream duty[7:0] may remain at a single/constant level/value during n frames. That the k LSBs are fixed as the single/constant level/value may mean that the k LSBs are maintained at the binary level 0 for transistors of the dimming controller 110 that correspond to the k LSBs to be continuously off (i.e., remain off) during the n frames. In an embodiment, k may be a natural number of 1 or more, and n may be a natural number of 2 or more. In an embodiment, n may be $2^k$.

For example, in the embodiment of FIG. 2, k may be 2 and n may be 4. In an embodiment, b1 and b0 corresponding to the LSBs may be the binary level 0 during four frames.

That is, the timing controller 10 may determine a duty ratio bit stream including (m−k) most significant bits (MSBs) and k LSBs having a fixed value, during the n frames.

Accordingly, switching control is not separately performed on transistors corresponding to LSBs, so that the power consumption of the dimming controller 110 can be reduced. Although the switching control is not separately perform on the transistors corresponding to the LSBs, MSBs are partially changed, so that emission control can be performed to express a dimming level equal or approximate to a target dimming level.

The signal converter 120 converts the received duty ratio bit stream duty[7:0] to be suitable for specifications of the emission control driver 30, and supplies the converted duty ratio bit stream as a portion of the control signal CONT3 to the emission control driver 30. For example, the signal converter 120 may be a serializer.

The emission control driver 30 may generate an emission control signal having a duty ratio corresponding to the duty ratio bit stream duty[7:0], based on the received control signal CONT3, and supply (instances/copies of) the generated emission control signals E1, E2, . . . , and En to the emission control lines.

In an embodiment, the timing controller 10 may determine a duty ratio bit stream including k uppermost extension bits substituting for the k LSBs, the (m−k) MSBs, and the k LSBs having a fixed value, for the n frames. In this embodiment, the duty ratio bit stream may be configured to (m+k) bits.

For example, the timing controller 10 may express the k uppermost extension bits using bit signal lines corresponding to the k LSBs in the duty ratio bit stream duty[7:0], and the k LSBs may be assumed as 0 during the n frames.

Referring to FIG. 2, the first MSB of the duty ratio bit stream duty[7:0] is b7, but LSBs b1 and b0 may be used as if they are b9 and b8 as the uppermost extension bits. In an embodiment, the LSBs b1 and b0 may be assumed as 0.

In an embodiment, the eight transistors of the dimming controller 110 are all used, so that the number of expressible dimming levels can be increased without reducing switching control power. In particular, this is effective with respect to a low-resolution display panel.

In an embodiment, the k LSBs can be assumed as 0 for the n frames.

Figure 3:
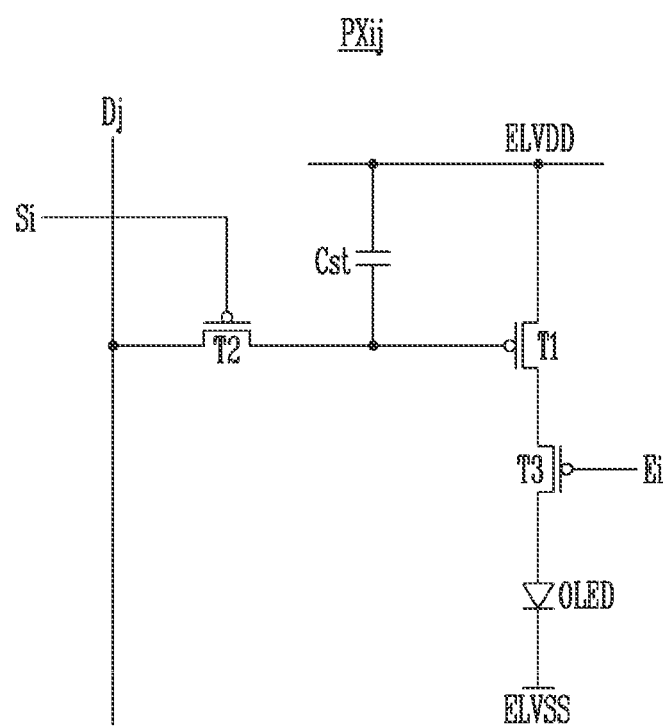
FIG. 3 is a diagram (e.g., a circuit diagram) illustrating a pixel according to an embodiment.
Figure 4:
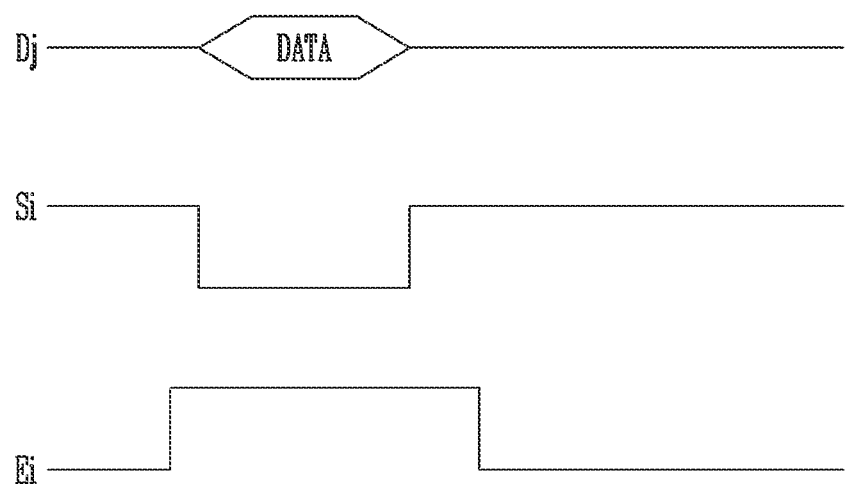
FIG. 4 is a timing diagram illustrating operation of the pixel of FIG. 3 according to an embodiment.

FIG. 3 is a diagram illustrating a pixel according to an embodiment. FIG. 4 is a timing diagram illustrating the pixel of FIG. 3 according to an embodiment.

Referring to FIG. 3, the pixel PXij may include a plurality of transistors T1, T2, and T3, a storage capacitor Cst, and an organic light emitting diode OLED.

In an embodiment, the circuit of the pixel PXij is configured with P-type transistors. In an embodiment, the circuit may include N-type transistors.

One end of the transistor T2 may be coupled to a data line Dj, and a gate terminal of the transistor T2 may be coupled to a scan line Si. The transistor T2 may be called as a scanning transistor.

A gate terminal of the transistor T1 may be coupled to the other end of the transistor T2, and one end of the transistor T1 may be coupled to a voltage source ELVDD. The transistor T1 may be called as a driving transistor.

The storage capacitor Cst may connect the gate terminal and one end of the transistor T1.

One end of the transistor T3 may be coupled to the other end of the transistor T1, a gate terminal of the transistor T3 may be coupled to an emission control line Ei, and the other end of the transistor T3 may be coupled to an anode of the organic light emitting diode OLED. The transistor T3 may be called as an emission control transistor.

A cathode of the organic light emitting diode OLED may be coupled to a voltage source ELVSS.

Referring to FIG. 4, when a scan signal having a low level is supplied through the scan line Si, the transistor T2 is turned on, and a data voltage DATA applied to the data line Dj is applied to the gate terminal of the transistor T1 through the turned-on transistor T2.

The storage capacitor Cst stores a voltage corresponding to the difference between the data voltage DATA and the voltage source ELVSS. Since the transistor T3 is in an off-state, no current flows through the organic light emitting diode OLED even when the transistor T1 is turned on.

When an emission control signal having a low level is supplied through the emission control line Ei, a driving current flows toward the organic light emitting diode OLED from the voltage source ELVDD through the transistor T1 and the transistor T3. Thus, the organic light emitting diode OLED emits light with a luminance that is in proportion to the magnitude of the driving current. In an embodiment, the magnitude of the driving current is in proportion to a voltage maintained by the storage capacitor Cst.

The duty ratio of the emission control signal may be a ratio of a time (or duration) for which the emission control signal having the low level flows through the emission control line Ei to a time (or duration) for which the emission control signal having a high level flows through the emission control line Ei. For example, as the duty ratio of the emission control signal becomes higher, the time for which the emission control signal having the low level flows to allow the emission control transistor T3 to be turned on may become longer. As the duty ratio of the emission control signal becomes lower, the time for which the emission control signal having the high level flows to allow the emission control transistor T3 to be/remain turned off may become longer.

In an embodiment, the duty ratio of the emission control signal may be associated with a frame.

Figure 5:
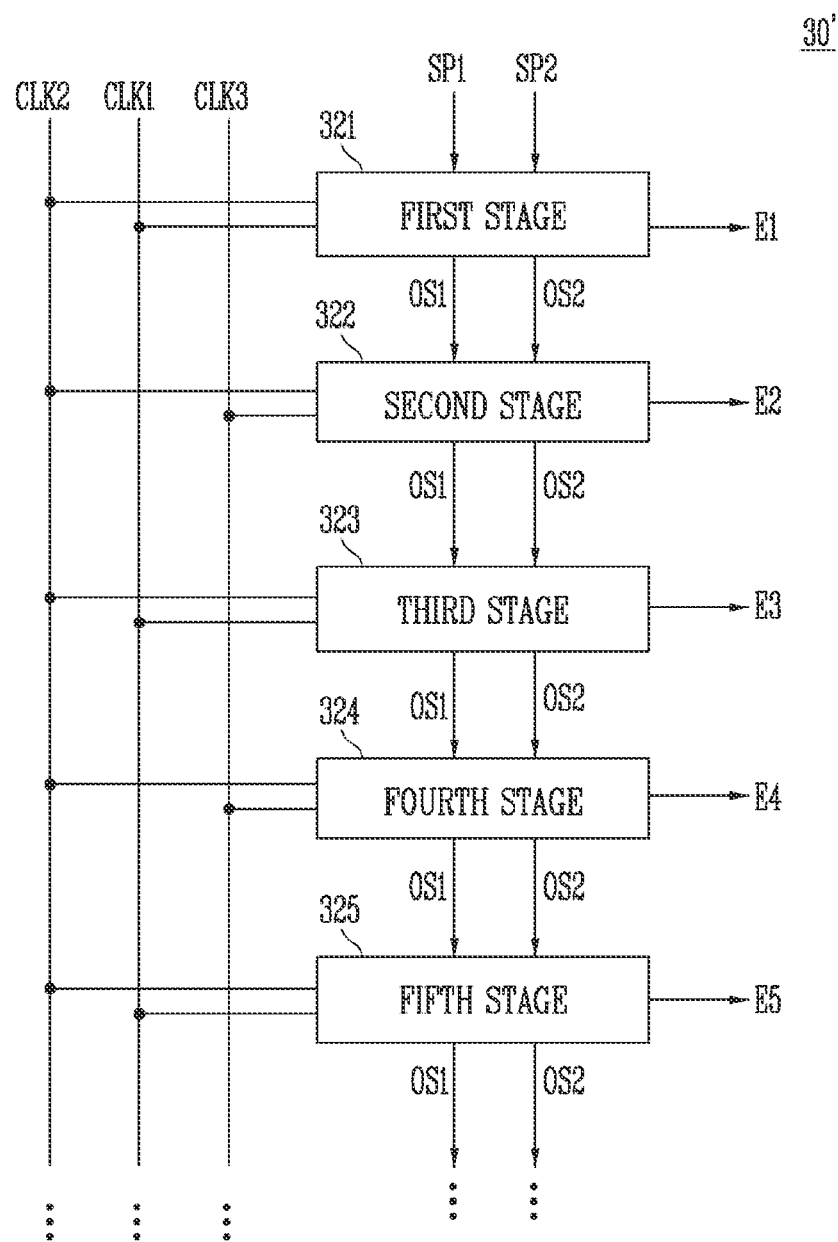
FIG. 5 is a diagram (e.g., a block diagram) illustrating an emission control driver according to an embodiment.

FIG. 5 is a diagram illustrating an emission control driver according to an embodiment.

Referring to FIG. 5, the emission control driver 30' receives, as the control signal CONT3, a plurality of clock signals CLK1, CLK2, and CLK3 and two start signals SP1 and SP2, and includes a plurality of stages 321, 322, 323, 324, 325, . . . .

The plurality of stages 321, 322, 323, 324, 325, . . . may be coupled to emission control lines E1, E2, E3, E4, E5, . . . , respectively.

Each of the stages 322, 323, 324, 325, . . . as start signals, output signals OS1 and OS2 output from a previous stage thereof.

In an embodiment, the clock signal CLK2 is supplied to all of the stages 321, 322, 323, 324, 325, . . . , the clock signal CLK1 is supplied to odd-numbered stages 321, 323, 325, . . . , and the clock signal CLK3 is supplied to even-numbered stages 322, 324, . . . .

The clock signals CLK1, CLK2, and CLK3 may be set to have the same period, and a first start signal SP1 and a second start signal SP2 may be supplied once or more times during one frame period.

According to an embodiment, the width of an emission control signal may be determined corresponding to a width (or interval/space) between the first start signal SP1 and the second start signal SP2 (i.e., a time until the second start signal SP2 has the low level after the first start signal SP1 has the low level). For example, as the width between the first start signal SP1 and the second start signal SP2 is set wider, the duty ratio of the emission control signal may become lower. For example, as the width between the first start signal SP1 and the second start signal SP2 is set narrower, the duty ratio of the emission control signal may become higher.

The width between a first output signal OS1 and a second output signal OS2 output from the first stage 321 may correspond to that between the first start signal SP1 and the second start signal SP2. Therefore, the other stages 322, 323, 324, 325, . . . may all have the same duty ratio of the emission control signal as that associated with the first stage 321.

Figure 6:
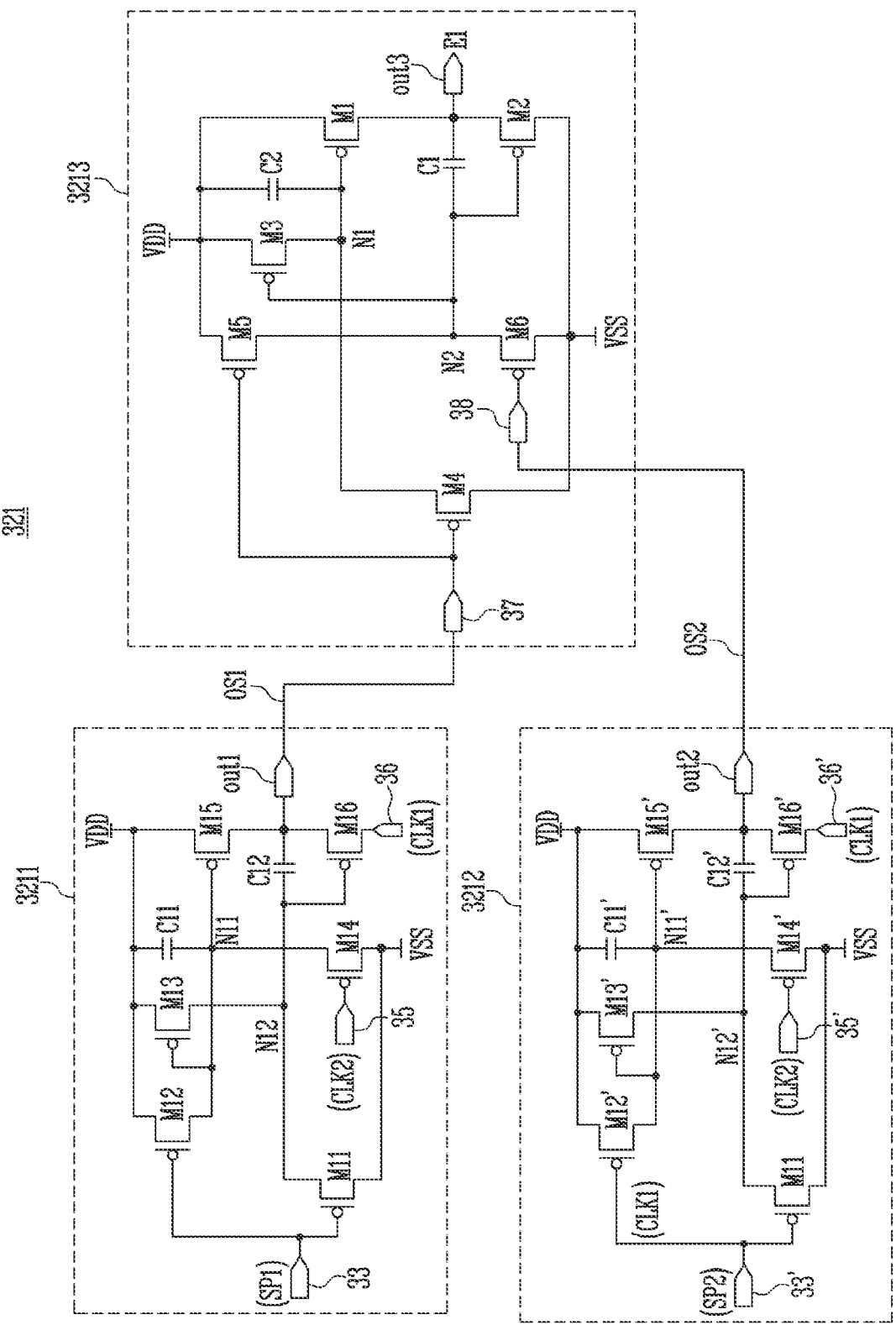
FIG. 6 is a diagram (e.g., a circuit diagram) illustrating one stage of the emission control driver of FIG. 5 according to an embodiment.
Figure 7:
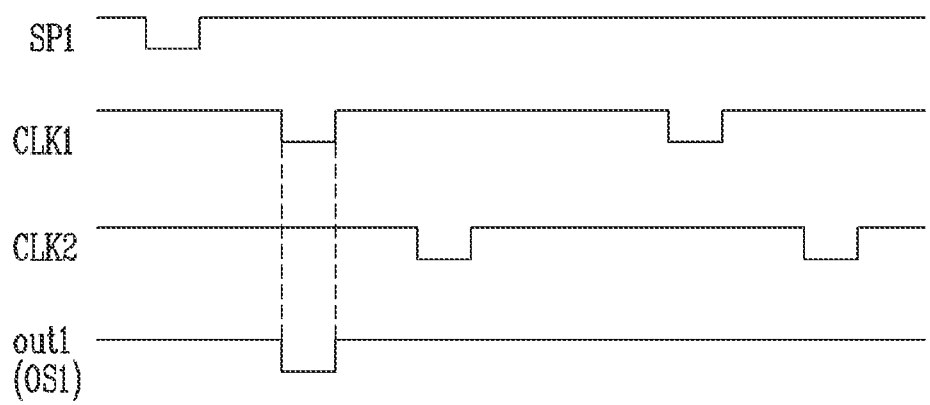
FIG. 7 is a diagram illustrating a driving phase of a first driver of the stage of FIG. 6 according to an embodiment.
Figure 8:
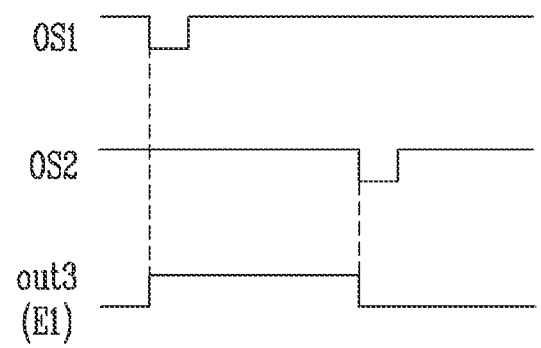
FIG. 8 is a diagram illustrating a driving phase of a third driver of the stage of FIG. 6 according to an embodiment.

FIG. 6 is a diagram illustrating one stage of the emission control driver of FIG. 5 according to an embodiment. FIG. 7 is a diagram illustrating a driving/operating phase of a first driver of the stage of FIG. 6 according to an embodiment. FIG. 8 is a diagram illustrating a driving/operating phase of a third driver of the stage of FIG. 6 according to an embodiment.

Referring to FIG. 6, a circuit of the first stage 321 of the emission control driver 30' is illustrated. Circuit configurations of the other stages 322, 323, 324, 325, . . . may be substantially identical to that of the first stage 321 except connections related to input signals, and therefore the first stage 321 is described as an example for all these stages.

The first stage 321 may include a first driver 3211, a second driver 3212, and a third driver 3213.

The first driver 3211 may generate a first output signal OS1 using clock signals CLK1 and CLK2 and a first start signal SP1.

The second driver 1312 may generate a second output signal OS2 using clock signals CLK1 and CLK2 and a second start signal SP2. The circuit configuration of the second driver 3212 may be identical to that of the first driver 3211.

The third driver 3213 may generate an emission control signal E1 using the first output signal OS1 and the second output signal OS2.

The first driver 3211 outputs the voltage of a voltage source VDD or the clock signal CLK1 as the first output signal OS1. In an embodiment, the first driver 3211 includes six transistors M11 to M16 and two capacitors C11 and C12.

The voltage source VDD is set to a voltage higher than that of a voltage source VSS. For example, the voltage source VDD may be set to a voltage at which the transistors can be turned off, and the voltage source VSS may be set to a voltage at which the transistors can be turned on.

One end of the transistor M15 is coupled to the voltage source VDD, and the other end of the transistor M15 is coupled to an output terminal out1. In addition, a gate terminal of the transistor M15 is coupled to a node N11.

On end of the transistor M16 is coupled to the output terminal out1, and the other end of the transistor M16 is coupled to an input terminal 36. In addition, a gate terminal of the transistor M16 is coupled to a node N12. The input terminal 36 is supplied with the clock signal CLK1.

One end of the transistor M14 is coupled to the node N11, and the other end of the transistor M14 is coupled to the voltage source VSS. In addition, a gate terminal of the transistor M14 is coupled to an input terminal 35. The input terminal 35 is supplied with the clock signal CLK2.

One end of the transistor M13 is coupled to the voltage source VDD, and the other end of the transistor M13 is coupled to the node N12. In addition, a gate terminal of the transistor M13 is coupled to the node N11.

One end of the transistor M12 is coupled to the voltage source VDD, and the other end of the transistor M12 is coupled to the node N11. In addition, a gate terminal of the transistor M12 is coupled to an input terminal 33. The input terminal 33 is supplied with the first start signal SP1.

One end of the transistor M11 is coupled to the node N12, and the other end of the transistor M11 is coupled to the voltage source VSS. In addition, a gate terminal of the transistor M11 is coupled to the input terminal 33.

The capacitor C11 is coupled between the gate terminal of the transistor M15 and the voltage source VDD. The capacitor C11 charges a voltage corresponding to the turn-on or turn-off of the transistor M15.

The capacitor C12 is coupled between the gate terminal of the transistor M16 and the output terminal out1. The capacitor C12 charges a voltage corresponding to the turn-on or turn-off of the transistor M16.

In an embodiment, the configuration of the second driver 3212 is identical to that of the first driver 3211 except that the second start signal SP2 is supplied to an input terminal 33'. Therefore, descriptions common to the first driver 3211 and the second driver 3212 are not repeated.

FIG. 7 is a diagram illustrating an operation process of the first driver 3211 according to an embodiment.

The operation process is described with reference to FIGS. 6 and 7. When the first start signal SP1 is supplied at a low level, the transistor M11 and the transistor M12 are turned on.

When the transistor M11 is turned on, the voltage of the voltage source VSS is supplied to the node N12. When the voltage of the voltage source VSS is supplied to the node N12, the transistor M16 is turned on. When the transistor M16 is turned on, the input terminal 36 is coupled to the output terminal out1. In addition, a voltage corresponding to the turn-on of the transistor M16 is charged in the capacitor C12.

In an embodiment, when the transistor M12 is turned on, the voltage of the voltage source VDD is supplied to the node N11. When the voltage of the voltage source VDD is supplied to the node N11, the transistor M13 and the transistor M15 are turned off.

Subsequently, the first start signal SP1 is supplied at a high level. When the first start signal SP1 is supplied at the high level, the transistor M11 and the transistor M12 are turned off. At this time, the transistor M16 maintains the turn-on state due to the voltage charged in the capacitor C12. The clock signal CLK1 is supplied to the output terminal out1 during a period in which the transistor M16 maintains the turn-on state.

After the clock signal CLK1 is supplied, the clock signal CLK2 is supplied. When the clock signal CLK2 is supplied, the transistor M14 is turned on. When the transistor M14 is turned on, the voltage of the voltage source VSS is supplied to the node N11. When the voltage of the voltage source VSS is supplied to the node N11, the transistor M13 and the transistor M15 are turned on.

When the transistor M13 is turned on, the voltage source VDD is coupled to the node N12. Accordingly, the transistor M16 is turned off. When the transistor M15 is turned on, the voltage source VDD is coupled to the output terminal out1. At this time, the capacitor C11 charges a voltage corresponding to the turn-on of the transistor M15. In an embodiment, the transistor M15 supplies the voltage of the voltage source VDD to the output terminal out1 until before the transistor M12 is turned on by a next first start signal SP1.

As described above, the first driver 3211 supplies a next clock signal CLK1 (low level) to the output terminal out1 after the first start signal SP1 is supplied. Similarly, the second driver 3212 supplies a next clock signal CLK1 to an output terminal out2 when the second start signal SP2 is supplied. Thus, the interval between the first output signal OS1 and the second output signal OS2, which are respectively output from the first driver 1311 and the second driver 1312, corresponds to that between the first start signal SP1 and the second start signal SP2.

The configuration of the third driver 3213 is described with reference to FIG. 6.

In the third driver 3213, the voltage source VDD or the voltage source VSS is coupled to an output terminal out3, corresponding to the first output signal OS1 and the second output signal OS2. In an embodiment, the third driver 3213 includes six transistors M1 to M6 and two capacitors C1 and C2.

One end of the transistor M1 is coupled to the voltage source VDD, and the other end of the transistor M1 is coupled to the output terminal out3. In addition, a gate terminal of the transistor M1 is coupled to a node N1.

One end of the transistor M2 is coupled to the output terminal out3, and the other end of the transistor M2 is coupled to the voltage source VSS. In addition, a gate terminal of the transistor M2 is coupled to a node N2.

One end of the transistor M3 is coupled to the voltage source VDD, and the other end of the transistor M3 is coupled to the node N1. In addition, a gate terminal of the transistor M3 is coupled to the node N2.

The capacitor C1 is coupled between the gate terminal of the transistor M2 and the output terminal out3. The capacitor C1 stores a voltage corresponding to the turn-on or turn-off of the transistor M2.

The capacitor C2 is coupled between the gate terminal of the transistor M1 and the voltage source VDD. The capacitor C2 charges a voltage corresponding to the turn-on or turn-off of the transistor M1.

One end of the transistor M5 is coupled to the voltage source VDD, and the other end of the transistor M5 is coupled to the node N2. In addition, a gate terminal of the transistor M5 is coupled to an input terminal 37. The input terminal 37 is supplied with the first output signal OS1.

One end of the transistor M6 is coupled to the node N2, and the other end of the transistor M6 is coupled to the voltage source VSS. In addition, a gate terminal of the transistor M6 is coupled to an input terminal 38. The input terminal 38 is supplied with the second output signal OS2.

One end of the transistor M4 is coupled to the node N1, and the other end of the transistor M4 is coupled to the voltage source VSS. In addition, a gate terminal of the transistor M4 is coupled to the input terminal 37. The fourth transistor M4 is turned on or turned off corresponding to a voltage supplied to the input terminal 37.

FIG. 8 is a diagram illustrating an operation process of the third driver 3213 according to an embodiment.

When the first output signal having a low level is supplied to the input terminal 37, the transistor M4 and the transistor M5 are turned on. At this time, since the input terminal 38 is supplied with a high-level voltage, the transistor M6 is turned off.

When the transistor M5 is turned on, the voltage of the voltage source VDD is supplied to the node N2. In an embodiment, the transistor M2 and the transistor M3, which are coupled to the node N2, are turned off.

When the transistor M4 is turned on, the voltage of the voltage source VSS is supplied to the first node N1. In an embodiment, the transistor M1 coupled to the node N1 is turned on. When the transistor M1 is turned on, the voltage of the voltage source VDD is supplied to the output terminal out3. Thus, an emission control signal having a high level is supplied to an emission control line E1 coupled to the output terminal out3.

In an embodiment, the capacitor C2 charges a voltage corresponding to the turn-on of the transistor M1, and the capacitor C1 charges a voltage corresponding to the turn-off of the transistor M2. Thus, as a high-level voltage is supplied to the input terminal 37, the voltage of the voltage source VDD is supplied to the output terminal out3 while the transistor M1 is maintaining the turn-on state and the transistor M2 is maintaining the turn-off state even when the transistors M4 and M5 are turned off.

Subsequently, as the second output signal OS2 having the low level is supplied to the input terminal 38, the transistor M6 is turned on. At this time, as the high-level voltage is supplied to the input terminal 37, the transistor M4 and the transistor M5 are in the turn-off state.

When the transistor M6 is turned on, the voltage of the voltage source VSS is supplied to the node N2. In an embodiment, the transistor M3 and the transistor M2, which are coupled to the node N2, are turned on.

When the transistor M3 is turned on, the voltage of the voltage source VDD is supplied to the node N1. In an embodiment, the transistor M1 coupled to the node N1 is turned off. When the transistor M2 is turned on, the voltage of the voltage source VSS is supplied to the output terminal out3. Thus, the emission control signal having the low level is supplied to the emission control line E1 coupled to the output terminal out3.

Figure 9:
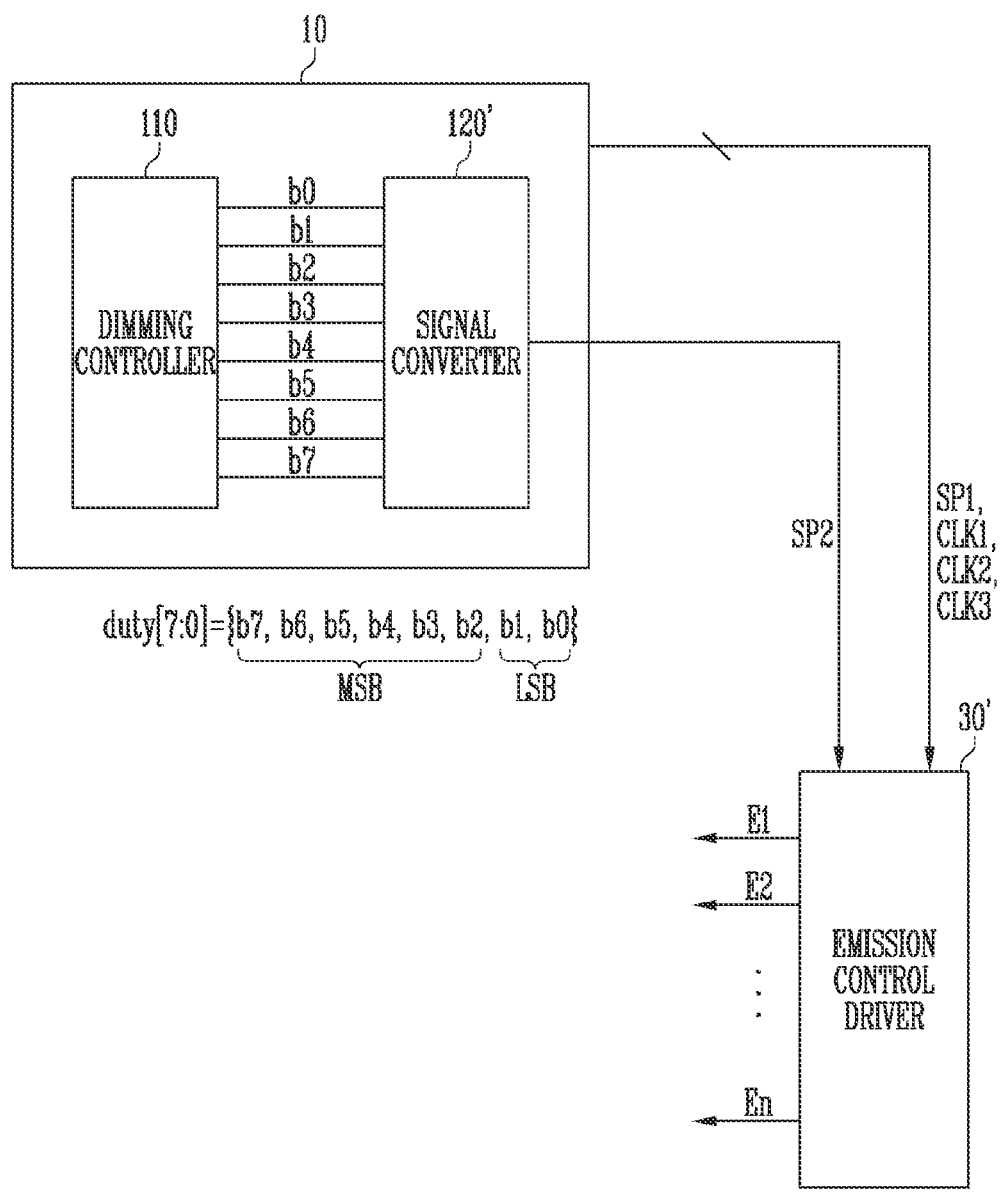
FIG. 9 is a diagram illustrating a timing controller including the emission control driver of FIG. 5 according to an embodiment.

FIG. 9 is a diagram illustrating a timing controller including the emission control driver discussed with reference to FIG. 5 according to an embodiment.

Referring to FIG. 9, like FIG. 2, the timing controller 10 includes a dimming controller 110 and a signal converter 120'. The signal converter 120' is configured suitable for the configuration of the emission control driver 30'.

The signal converter 120' may supply the second start signal SP2 having the low level such that the duty ratio of the emission control signal correspond to the duty ratio bit stream duty[7:0]. As described above, the duty ratio of the emission control signal may be controlled by controlling the interval between the first start signal SP1 having the low level and the second start signal having the low level.

The control of the duty ratio bit stream duty[7:0], which is performed by the dimming controller 110, may have features substantially identical to or analogs to features discussed with reference to FIG. 2, and therefore related descriptions are not repeated.

Figure 10:
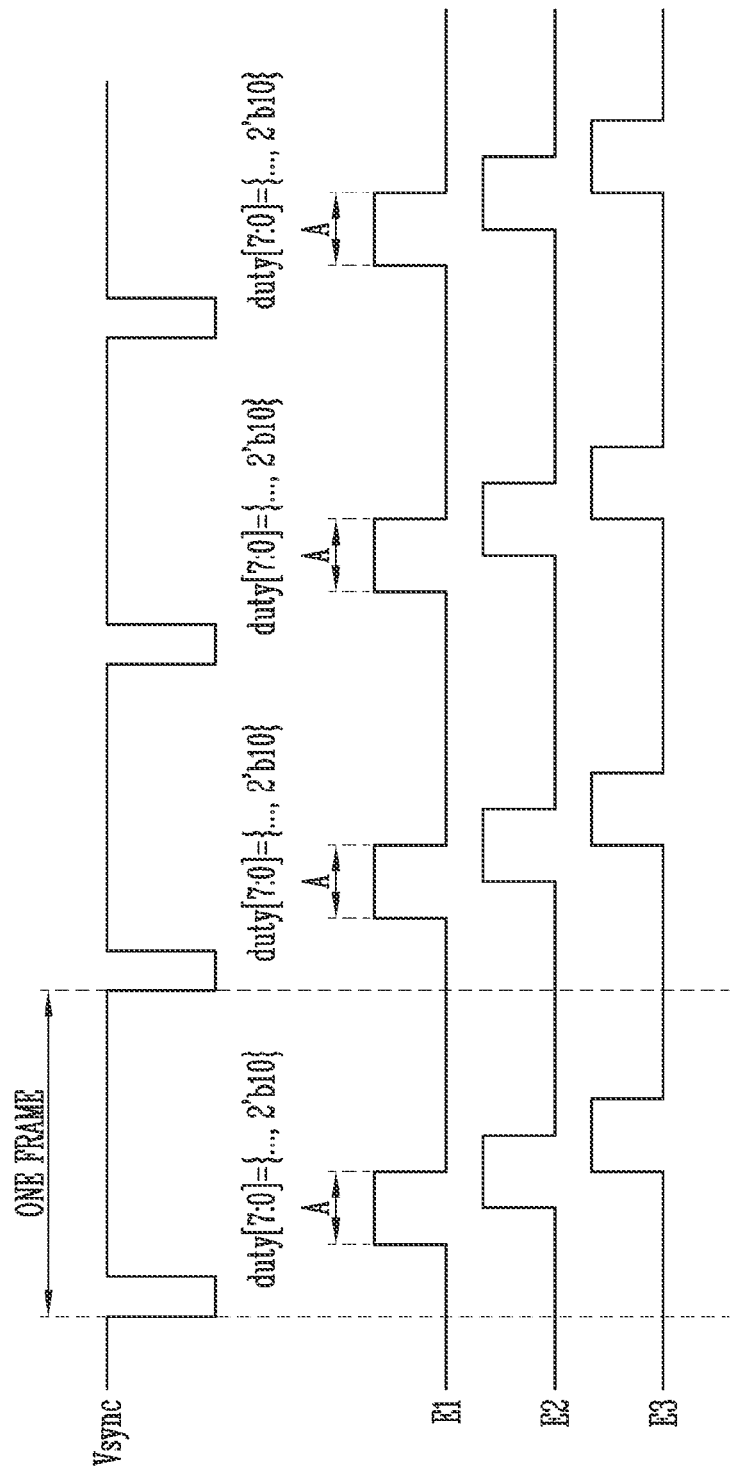
FIG. 10 is a diagram illustrating emission control according to an embodiment.

FIG. 10 is a diagram illustrating emission control according to an embodiment.

Referring to FIG. 10, frames may be separated based on the vertical synchronization signal Vsync. The emission control driver 30 may be implemented in the form of a shift register, and emission control signals E2, E3, . . . having a pulse form substantially identical to that of the emission control signal E1 from the first stage may be sequentially output from next stages. The emission control driver 30' described with reference to FIGS. 5 to 8 may be an example of the emission control driver 30.

Referring to FIG. 10, the timing controller 10 determines a duty ratio using all of the LSBs and MSBs of the duty ratio bit stream duty[7:0]. In FIG. 10, the LSB set is represented by 2'b10 (i.e., b1=1 and b0=0).

Since information on all bits of the duty ratio bit stream duty[7:0] is required, it is required to drive of all transistors coupled to the respective bit signal lines of the dimming controller 110, and the switching power of the dimming controller 110 is not reduced.

Figure 11:
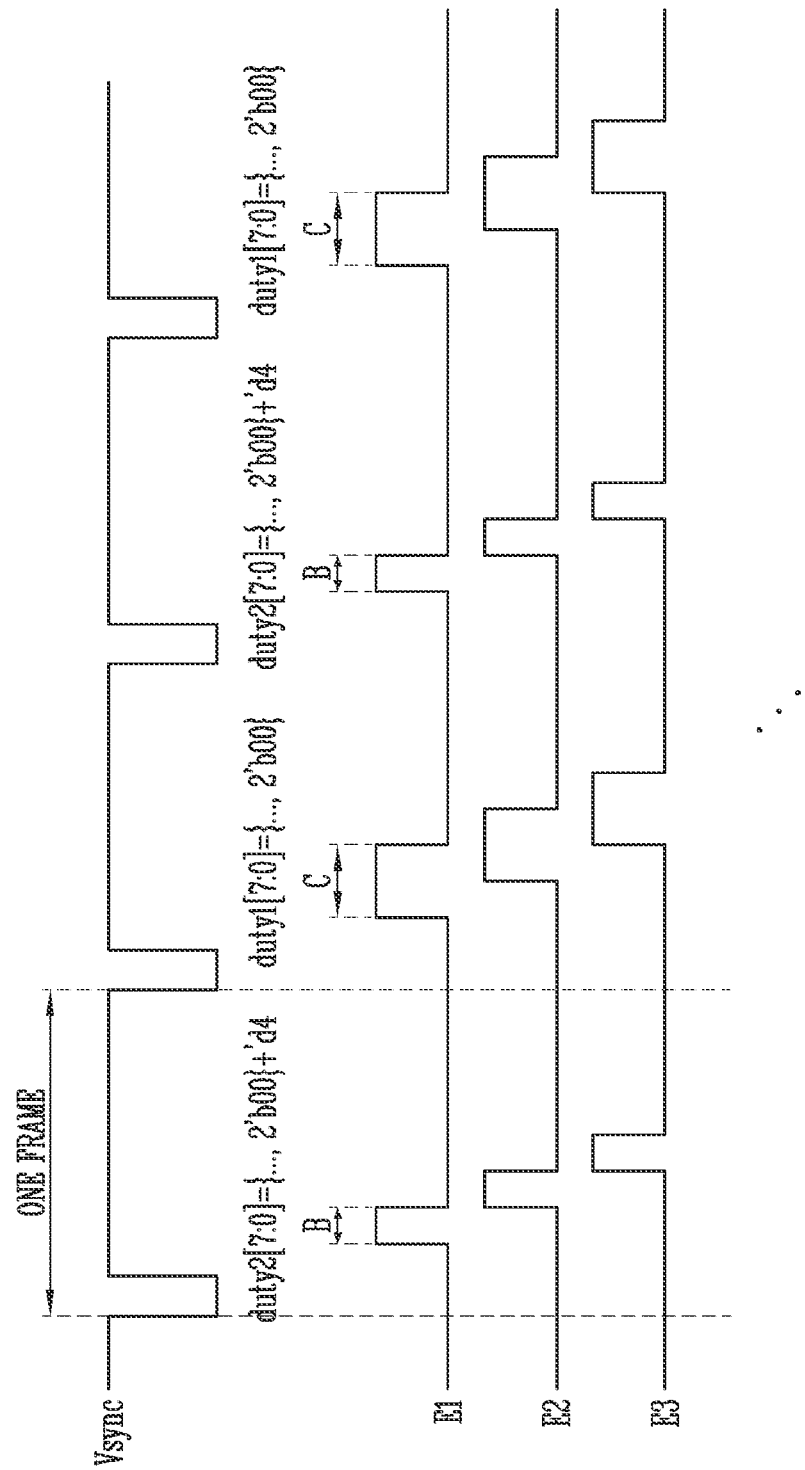
FIG. 11 is a diagram illustrating emission control according to an embodiment.

FIG. 11 is a diagram illustrating emission control according to an embodiment.

In an embodiment, k is 2, and n is 4.

Referring to FIG. 11, the timing controller 10 determines a duty ratio using (m−k) MSBs without using k LSBs in the duty ratio bit stream duty[7:0]. That is, the timing controller 10 determines a duty ratio using six MSBs but not two LSBs.

The dimming controller 110 does not control the switching of transistors coupled to bit signal lines corresponding to the two LSBs. In an embodiment, a default voltage corresponding to the binary level 0 may be applied to the bit signal lines corresponding to the LSBs. Thus, the switching control power consumption of transistors corresponding to the LSBs in the timing controller 10 can be reduced.

Since the timing controller 10 does not use the LSBs, a duty ratio equivalent/equal to that in FIG. 10 is to be expressed using only the MSBs. In an embodiment, the MSBs can express a duty ratio equal or approximate to that of FIG. 10 using a first duty ratio bit stream duty1[7:0] and a second duty ratio bit stream duty2[7:0], which are different from each other.

Frames of a first group among the n frames may be emission-controlled according to the first duty ratio bit stream duty1[7:0], and frames of a second group among the n frames may be emission-controlled according to the second duty ratio bit stream duty2[7:0].

In order to reduce switching power consumption, LSBs of the first duty ratio bit stream duty1[7:0] and the second duty ratio bit stream duty2[7:0] are not used, and therefore, each LSB may be set as 0.

If the total emission time and the total non-emission time associated with FIG. 11 are equal or approximate to the total emission time and the total non-emission time associated with FIG. 10 for n frames, an overall duty ratio equal or approximate to that of FIG. 10 may be expressed in the configuration associated with FIG. 11. That is, when the total sum of a time (C*2) for which the emission control transistor is turned off by the first duty ratio bit stream duty1 [7:0] and a time (B*2) for which the emission control transistor is turned off by the second duty ratio bit stream duty2[7:0] for the four frames illustrated in FIG. 11 is equal to a time (A*4) for which the emission control transistor is turned off by the duty ratio bit stream duty[7:0] for the four frames illustrated in FIG. 10, the same dimming level may be expressed. That is, (m−k) MSBs of an average value of the duty ratio bit streams during the n frames may correspond to (m−k) MSBs of the first duty ratio bit stream, and a dimming level equal or approximate to that of FIG. 10.

In an embodiment, the second duty ratio bit stream duty2[7:0] may have a value obtained by adding $2^k$ to a value of the first duty ratio bit stream duty1[7:0]. Since the duty ratio bit stream has k LSBs, the value of the LSBs is not changed even though $2^k$ (decimal number expression) is added. In the configuration associated with FIG. 11, since k is 2, the second duty ratio bit stream duty2[7:0] has a value obtained by adding 4 (decimal number expression) to the first duty ratio bit stream duty1[7:0].

In an embodiment, the second duty ratio bit stream duty2[7:0] may have a value obtained by adding a value larger than $2^k$ to the first duty ratio bit stream duty1[7:0].

In an embodiment, the frames of the first group and the frames of the second group may be time-divisionally alternately disposed/arranged. Accordingly, dithering is implemented, and thus it is possible to provide an image that is smoothly viewed by a user sensitive to a change in brightness.

In an embodiment, the LSB set is 2'b10 (i.e., b1=1 and b0=0), and two second duty ratio bit streams duty2[7:0] and two first duty ratio bit streams duty1[7:0] may be provided for four frames.

In an embodiment, the LSB set is 2'b11 (i.e., b1=1 and b0=1), and three second duty ratio bit streams duty2[7:0] and one first duty ratio bit stream duty1[7:0] may be provided for four frames.

In an embodiment, the LSB set is 2'b01 (i.e., b1=0 and b0=1), and one second duty ratio bit stream duty2[7:0] and three first duty ratio bit streams duty1[7:0] may be provided for four frames.

In an embodiment, the LSB set is 2'b00 (i.e., b1=0 and b0=0), no second duty ratio bit stream duty2[7:0] and four first duty ratio bit streams duty1[7:0] may be provided for four frames, and duty ratio bit streams associated with the configuration of FIG. 10 may be equivalent to duty ratio bit streams associated with the configuration of FIG. 11.

The parameter values k=2, n=4, and m=8 are given as examples. The parameter values may be configured according to particular embodiments, e.g., particular products and/or operating environments.

In a display device and a driving method thereof according to an embodiment, a dimming level similar to a target dimming level can be expressed with minimum switching power consumption of the dimming controller.

In a display device and a driving/operating method thereof according to an embodiment, the number of dimming levels expressible in a low-resolution display panel can be maximized.

Example embodiments have been described. Although specific terms are employed, they are to be interpreted in a generic and descriptive sense and not for purpose of limitation. In some instances, features, characteristics, and/or elements described in connection with a particular embodiment may be used singly or in combination with features, characteristics, and/or elements described in connection with other embodiments unless otherwise specifically indicated. Various changes in form and details may be made to the described embodiments without departing from the spirit and scope set forth in the following claims.

What is claimed is:

1. A timing controller comprising:
    a dimming controller configured to determine a duty ratio of an emission control signal based on a duty ratio bit stream configured with a plurality of bits, the emission control signal determining emission periods and non-emission periods of a pixel; and
    a signal converter configured to supply a control signal corresponding to the duty ratio to an emission control driver,
    wherein the dimming controller determines the duty ratio, by using partial bits among the plurality of bits of the duty ratio bit stream, and
    wherein a first length of one of the emission periods for a first frame is different from a second length of one of the emission periods for a second frame.

2. The timing controller of claim 1,
    wherein the plurality of bits of the duty ratio bit stream are m bits, wherein the partial bits are m−k most significant bits (MSBs) of the duty ratio bit stream, and wherein the k is a natural number of 1 or more, and the m is a natural number of 2 or more.

3. The timing controller of claim 1, wherein the first length is determined by a first duty ratio bit stream, and wherein the second length is determined by a second duty ratio bit stream.

4. The timing controller of claim 3, wherein the second duty ratio bit stream has a value obtained by adding 2 k to the first duty ratio bit stream, and wherein the k is a natural number of 1 or more.

5. The timing controller of claim 4, wherein the first frame and the second frame are time-divisionally alternately disposed.

6. The timing controller of claim 2, wherein m−k MSBs of an average value of duty ratio bit streams during consecutive frames correspond to m−k MSBs of a first duty ratio bit stream determining the first length.

7. A method for driving a timing controller, the method comprising:

determining a first duty ratio of an emission control signal for a first frame by using partial bits among a plurality of bits of a first duty ratio bit stream, the emission control signal determining emission periods and non-emission periods of a pixel;

supplying a control signal corresponding to the first duty ratio to an emission control driver;

determining a second duty ratio of the emission control signal for a second frame after the first frame by using partial bits among a plurality of bits of a second duty ratio bit stream; and supplying the control signal corresponding to the second duty ratio to the emission control driver, wherein a first length of one of the emission periods for the first frame is different from a second length of one of the emission periods for the second frame.

8. The method of claim 7, wherein the plurality of bits of each of the first and second duty ratio bit streams are m bits, wherein the partial bits of each of the first and second duty ratio bit streams are m−k most significant bits (MSBs), and wherein the k is a natural number of 1 or more, and the m is a natural number of 2 or more.

9. The method of claim 7, wherein the first frame and the second frame are time-divisionally alternately disposed.

10. The method of claim 8, wherein m−k MSBs of an average value of duty ratio bit streams during consecutive frames correspond to m−k MSBs of the first duty ratio bit stream determining the first length.

* * * * *